(12) United States Patent
Kozicki et al.

(10) Patent No.: US 7,101,728 B2
(45) Date of Patent: *Sep. 5, 2006

(54) PROGRAMMABLE STRUCTURE INCLUDING AN OXIDE ELECTROLYTE AND METHOD OF FORMING PROGRAMMABLE STRUCTURE

(75) Inventors: Michael N. Kozicki, Phoenix, AZ (US); Maria Mitkova, Mesa, AZ (US); Chakravarthy Gopalan, Tempe, AZ (US); Muralikrish Balakrishnan, Tempe, AZ (US)

(73) Assignee: Axon Technologies Corporation, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/796,808

(22) Filed: Mar. 8, 2004

(65) Prior Publication Data

US 2004/0235204 A1 Nov. 25, 2004

Related U.S. Application Data

(63) Continuation-in-part of application No. 10/390,268, filed on Mar. 17, 2003, now Pat. No. 6,927,411, which is a continuation-in-part of application No. 10/268,107, filed on Oct. 9, 2002, now Pat. No. 6,985,378, which is a continuation-in-part of application No. 10/118,276, filed on Apr. 8, 2002, now Pat. No. 6,825,489, and a continuation-in-part of application No. 09/951,882, filed on Sep. 10, 2001, now Pat. No. 6,635,914, which is a continuation-in-part of application No. 09/502,915, filed on Feb. 11, 2000, now Pat. No. 6,487,106.

(60) Provisional application No. 60/452,648, filed on Mar. 7, 2003, provisional application No. 60/365,602, filed on Mar. 18, 2002, provisional application No. 60/365,601, filed on Mar. 18, 2002, provisional application No. 60/365,551, filed on Mar. 18, 2002, provisional application No. 60/364,547, filed on Mar. 15, 2002.

(51) Int. Cl.
*H01L 21/00* (2006.01)
*H00L 29/10* (2006.01)

(52) U.S. Cl. .................. 438/104; 257/43; 257/E45.002

(58) Field of Classification Search ............... 257/3, 257/4, 21, 298, 52, 55, 63, 42–44, E45.001, 257/E45.002; 365/107, 153; 438/48, 95, 438/102–104
See application file for complete search history.

(56) References Cited

U.S. PATENT DOCUMENTS

| | | | |
|---|---|---|---|
| 5,761,115 A * | 6/1998 | Kozicki et al. | 365/182 |
| 6,418,049 B1 * | 7/2002 | Kozicki et al. | 365/174 |
| 6,487,106 B1 * | 11/2002 | Kozicki | 365/153 |
| 6,818,481 B1 * | 11/2004 | Moore et al. | 438/130 |

* cited by examiner

Primary Examiner—Brook Kebede
(74) Attorney, Agent, or Firm—Snell & Wilmer L.L.P.

(57) ABSTRACT

A microelectronic programmable structure suitable for storing information and methods of forming and programming the structure are disclosed. The programmable structure generally includes an oxide ion conductor and a plurality of electrodes. Electrical properties of the structure may be altered by applying energy to the structure, and thus information may be stored using the structure.

32 Claims, 5 Drawing Sheets

PROGRAMMABLE STRUCTURE INCLUDING AN OXIDE ELECTROLYTE AND METHOD OF FORMING PROGRAMMABLE STRUCTURE

CROSS REFERENCE TO RELATED APPLICATIONS

This application is a continuation-in-part of U.S. patent application Ser. No. 10/390,268, entitled PROGRAMMABLE STRUCTURE, AN ARRAY INCLUDING THE STRUCTURE, AND METHODS OF FORMING THE SAME, filed Mar. 17, 2003, now U.S. Pat. No. 6,927,411, which claims priority to U.S. Patent Application Ser. No. 60/364,547, entitled PASSIVE MEMORY ARRAYS USING THE PROGRAMMABLE METALLIZATION CELL, filed Mar. 15, 2002; U.S. Patent Application Ser. No. 60/365,551, entitled PULSE MODE PROGRAMMABLE METALLIZATION CELL (PMPMC) TECHNOLOGY, filed Mar. 18, 2002; U.S. Patent Application Ser. No. 60/365,602, entitled METHOD AND APPARATUS TO INCREASE SPEED OF ELECTRODEPOSIT FORMATION AND ELECTRODEPOSIT DENSITY IN PROGRAMMABLE METALLIZATION CELL DEVICES, filed Mar. 18, 2002; and U.S. Patent Application Ser. No. 60/365,601, entitled PROGRAMMABLE METALLIZATION CELL MATERIALS, STRUCTURES AND DEVICES, filed Mar. 18, 2002, and which is a continuation-in-part of U.S. patent application Ser. No. 10/268,107, entitled PROGRAMMABLE MICROELECTRONIC DEVICE, STRUCTURE, AND SYSTEM AND METHOD OF FORMING THE SAME, filed Oct. 9, 2002, now U.S. Pat. No. 6,985,378, which is a continuation-in-part of application Ser. No. 10/118,276 entitled MICROELECTRONIC DEVICE, STRUCTURE, AND SYSTEM, INCLUDING A MEMORY STRUCTURE HAVING A VARIABLE PROGRAMMABLE PROPERTY AND METHOD OF FORMING SAME, filed Apr. 8, 2002, now U.S. Pat. No. 6,825,489, which is a continuation-in-part of application Ser. No. 09/502,915, entitled PROGRAMMABLE MICROELECTRONIC DEVICES AND METHODS OF FORMING AND PROGRAMMING SAME, filed Feb. 11, 2000; now U.S. Pat. No. 6,487,106, and is a continuation-in-part of U.S. patent application Ser. No. 09/951,882, entitled MICROELECTRONIC PROGRAMMABLE DEVICE AND METHODS OF FORMING AND PROGRAMMING THE SAME, filed Sep. 10, 2001; now U.S. Pat. No. 6,635,914, and claims the benefit of U.S. Patent Application Ser. No. 60/452,648, entitled FABRICATION OF PROGRAMMABLE METALLIZATION CELL DEVICES WITH OXIDE ELECTROLYTES, filed Mar. 7, 2003.

FIELD OF INVENTION

The present invention generally relates to programmable microelectronic devices. More particularly, the invention relates to programmable microelectronic structures and devices having an electrical property that can be variably programmed by manipulating an amount of energy supplied to the structure during a programming function and to methods of forming the structure.

BACKGROUND OF THE INVENTION

Memory devices are often used in electronic systems and computers to store information in the form of binary data. These memory devices may be characterized into various types, each type having associated with it various advantages and disadvantages.

For example, random access memory ("RAM"), which may be found in personal computers, is typically volatile semiconductor memory, in other words, the stored data is lost if the power source is disconnected or removed. Dynamic RAM ("DRAM") is particularly volatile in that it must be "refreshed" (i.e., recharged) every few hundred milliseconds in order to maintain the stored data. Static RAM ("SRAM") will hold the data after one writing so long as the power source is maintained; once the power source is disconnected, however, the data is lost. Thus, in these volatile memory configurations, information is only retained so long as the power to the system is not turned off. In general, these RAM devices can take up significant chip area and therefore may be expensive to manufacture and consume relatively large amounts of energy for data storage. Accordingly, improved memory devices suitable for use in personal computers and the like are desirable.

Other storage devices such as magnetic storage devices (e.g., floppy disks, hard disks and magnetic tape) as well as other systems, such as optical disks, CD-RW and DVD-RW are non-volatile, have extremely high capacity, and can be rewritten many times. Unfortunately, these memory devices are physically large, are shock/vibration-sensitive, require expensive mechanical drives, and may consume relatively large amounts of power. These negative aspects make such memory devices non-ideal for low power portable applications such as lap-top and palm-top computers, personal digital assistants ("PDAs"), and the like.

Due, at least in part, to a rapidly growing numbers of compact, low-power portable computer systems and hand-held appliances in which stored information changes regularly, low energy read/write semiconductor memories have become increasingly desirable and widespread. Furthermore, because these portable systems often require data storage when the power is turned off, non-volatile storage device are desired for use in such systems.

One type of programmable semiconductor non-volatile memory device suitable for use in such systems is a programmable read-only memory ("PROM") device. One type of PROM, a write-once read-many ("WORM") device, uses an array of fusible links. Once programmed, the WORM device cannot be reprogrammed.

Other forms of PROM devices include erasable PROM ("EPROM") and electrically erasable PROM (EEPROM) devices, which are alterable after an initial programming. EPROM devices generally require an erase step involving exposure to ultra violet light prior to programming the device. Thus, such devices are generally not well suited for use in portable electronic devices. EEPROM devices are generally easier to program, but suffer from other deficiencies. In particular, EEPROM devices are relatively complex, are relatively difficult to manufacture, and are relatively large. Furthermore, a circuit including EEPROM devices must withstand the high voltages necessary to program the device. Consequently, EEPROM cost per bit of memory capacity is extremely high compared with other means of data storage. Another disadvantage of EEPROM devices is that, although they can retain data without having the power source connected, they require relatively large amounts of power to program. This power drain can be considerable in a compact portable system powered by a battery.

Various hand-held appliances such as PDAs, portable phones, and the like as well as other electronic systems generally include a memory device coupled to a microprocessor and/or microcontroller formed on a separate substrate. For example, portable computing systems include a microprocessor and one or more memory chips coupled to a printed circuit board Forming memory devices and the microprocessor on separate substrates may be undesirable for several reasons. For example, forming various types of memory on separate substrate may be relatively expensive, may require relatively long transmission paths to communicate between the memory devices and any associated electronic device, and may require a relatively large amount of room within a system. Accordingly, memory structures that may be formed on the same substrate as another electronic device and methods of forming the same are desired. Furthermore, this memory technology desirably operates at a relatively low voltage while providing high speed memory with high storage density and a low manufacturing cost.

SUMMARY OF THE INVENTION

The present invention provides improved microelectronic programmable devices, structures, and systems and methods of forming the same. More particularly, the invention provides programmable structures that can be variably programmed depending on an amount of energy used to program the device. Such structures can replace both traditional nonvolatile and volatile forms of memory and can be formed on the same substrate as and/or overlying another microelectronic device.

The ways in which the present invention addresses various drawbacks of now-known programmable devices are discussed in greater detail below. However, in general, the present invention provides a programmable device that is relatively easy and inexpensive to manufacture, which is relatively easy to program, and which can be variably programmed In accordance with one exemplary embodiment of the present invention, a programmable structure includes an oxide ion conductor and at least two electrodes. The structure is configured such that when a bias is applied across two electrodes, one or more electrical properties of the structure change. In accordance with one aspect of this embodiment, a resistance across the structure changes when a bias is applied across the electrodes. In accordance with other aspects of this embodiment, a capacitance or other electrical property of the structure changes upon application of a bias across the electrodes. In accordance with a further aspect of this embodiment, an amount of change in the programmable property is manipulated by altering (e.g., thermally or electrically) an amount of energy used to program the device. One or more of these electrical changes and/or the amount of change may suitably be detected. Thus, stored information may be retrieved from a circuit including the structure.

In accordance with another exemplary embodiment of the invention, a programmable structure includes an oxide ion conductor, at least two electrodes, and a barrier interposed between at least a portion of one of the electrodes and the ion conductor. In accordance with one aspect of this embodiment, the barrier material includes a material configured to reduce diffusion of ions between the ion conductor and at least one electrode. In accordance with another aspect, the barrier material includes an insulating or high-resistance material. In accordance with yet another aspect of this embodiment, the barrier includes material that conducts ions, but which is relatively resistant to the conduction of electrons.

In accordance with another exemplary embodiment of the invention, a programmable microelectronic structure is formed on a surface of a substrate by forming a first electrode on the substrate, forming a layer of ion conductor material over the first electrode, and depositing conductive material onto the ion conductor material. In accordance with one aspect of this embodiment, a solid solution including the ion conductor and excess conductive material is formed by dissolving (e.g., via thermal, electro and/or photodissolution) a portion of the conductive material in the ion conductor. In accordance with a further aspect, only a portion of the conductive material is dissolved, such that a portion of the conductive material remains on a surface of the ion conductor to form an electrode on a surface of the ion conductor material. In accordance with another aspect of this embodiment of the invention, a structure including a high-resistance region is formed by dissolving a portion of the electrode such that a portion of the ion conductor includes a high concentration of the electrode material and another portion of the ion conductor includes a low concentration of the electrode material, such that the portion of the ion conductor with a low concentration of the electrode material forms a high resistance region within the structure. In accordance with yet a further aspect of this embodiment, an ion conductor is formed by depositing an oxide over a portion of the first electrode. In accordance with another aspect of this embodiment, the ion conductor is formed by exposing a portion of the first electrode to an oxidizing environment. And, in accordance with yet a further aspect of this embodiment, the ion conductor is formed by depositing a material such as silicon or tungsten and oxidizing at least a portion of the deposited material.

In accordance with yet another embodiment of the invention, pulse mode programming is used to read and write information In this case, information can be retrieved from the device using a destructive read or a destructive write process.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The present invention generally relates to programmable microelectronic devices and to methods of forming the devices.

Figure 1:
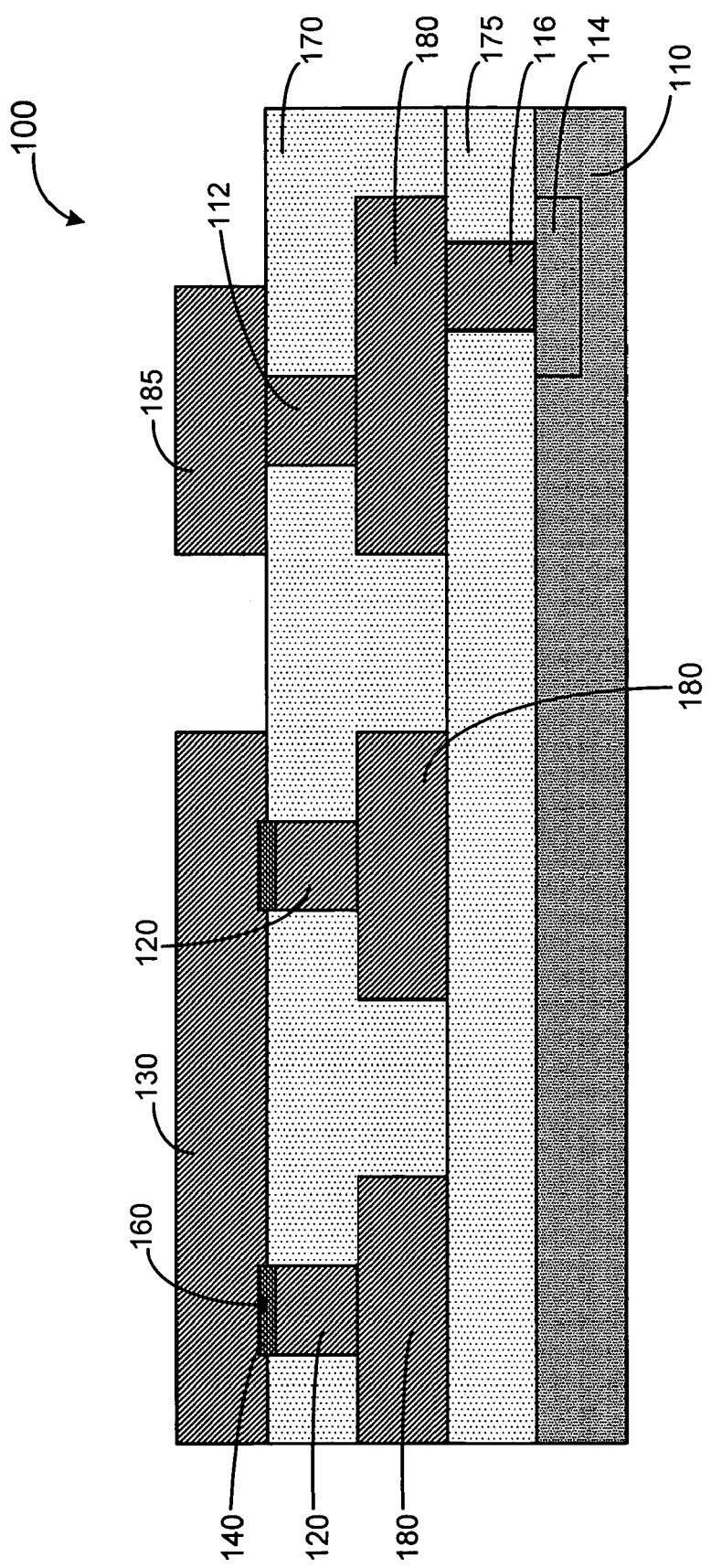
FIG. 1 is a cross-sectional illustration of a programmable structure formed on a surface of a substrate in accordance with an embodiment of the invention.

FIG. 1 illustrates a programmable microelectronic structures 100 formed on a surface of a substrate 110 in accordance with an exemplary embodiment of the present invention. Structure 100 includes electrodes 120 and 130, an ion conductor 140, and optionally include buffer or barrier layers or regions, which are discussed in more detail in U.S. application Ser. No. 10/390,268, entitled PROGRAMMABLE STRUCTURE, AN ARRAY INCLUDING THE STRUCTURE, AND METHODS OF FORMING THE SAME, filed Mar. 17, 2003, the contents of which are hereby incorporated herein by reference. Structures in accordance with the present invention may also include insulating layers 170, 175, and conductive layers 180, 185, as illustrated in FIG. 1. Other structures and devices in accordance with the present invention may include additional or alternative conductive, insulating, or other material layers as are commonly used in the manufacture of microelectronic devices.

Generally, structure 100 is configured such that when a bias greater than a threshold voltage ($V_T$), discussed in more detail below, is applied across electrodes 120 and 130, the electrical properties of structure 100 change. For example, in accordance with one embodiment of the invention, as a voltage $V \geq V_T$ is applied across electrodes 120 and 130, conductive ions within ion conductor 140 begin to migrate and form a region 160 having an increased conductivity compared to the bulk ion conductor (e.g., an electrodeposit) at or near the more negative of electrodes 120 and 130. As region 160 forms, the resistance between electrodes 120 and 130 decreases, and other electrical properties may also change.

In the absence of any barriers, the threshold voltage required to grow region 160 from one electrode toward the other and thereby significantly reduce the resistance of the device is approximately a few hundred millivolts. If the same voltage is applied in reverse, region 160 will dissolve back into the ion conductor and the device will return to a high resistance state. In a similar fashion, an effective barrier height of a diode that forms between an ion conductor and an electrode can be reduced by growing region 160; thus current flow may be increased through the structure, even if the resistance of the structure is substantially the same.

Structure 100 may be used to store information and thus may be used in memory circuits. For example, structure 100 or other programmable structures in accordance with the present invention may suitably be used in memory devices to replace DRAM, SRAM, PROM, EPROM, EEPROM devices, or any combination of such memory. In addition, programmable structures of the present invention may be used for other applications where programming or changing of electrical properties of a portion of an electrical circuit are desired.

Referring again to FIG. 1, substrate 110 may include any suitable material. For example, substrate 110 may include semiconductive, conductive, semiinsulative, insulative material, or any combination of such materials. In accordance with one embodiment of the invention, substrate 110 includes a portion 114 that includes a microelectronic device or portion thereof formed using a portion of the substrate. Portion 114 may be separated by additional layers (not shown) such as, for example, layers typically used to form integrated circuits. Because the programmable structures can be formed over insulating or other materials, the programmable structures of the present invention are particularly well suited for applications where substrate (e.g., semiconductor material) space is a premium. In addition, forming a memory cell overlying a microelectronic device may be advantageous because such a configuration allows greater data transfer between an array of memory cells and the microelectronic device using, for example, conductive plugs 112, 116 formed within layers 170 and 175.

Electrodes 120 and 130 may be formed of any suitable conductive material. For example, electrodes 120 and 130 may be formed of doped polysilicon material or metal.

In accordance with one exemplary embodiment of the invention, one of electrodes 120 and 130 is formed of a material including a metal that dissolves in ion conductor 140 when a sufficient bias ($V \geq V_T$) is applied across the electrodes (an oxidizable electrode) and the other electrode is relatively inert and does not dissolve during operation of the programmable device (an indifferent electrode). For example, electrode 130 may be an anode during a write process and be comprised of a material including silver that dissolves in ion conductor 140 and electrode 120 maybe a cathode during the write process and be comprised of an inert material such as tungsten, nickel, molybdenum, platinum, metal silicides, and the like. Having at least one electrode formed of a material including a metal that dissolves in ion conductor 140 facilitates maintaining a desired dissolved metal concentration within ion conductor 140, which in turn facilitates rapid and stable region 160 formation within ion conductor 140 or other electrical property change during use of structure 100. Furthermore, use of an inert material for the other electrode (cathode during a write operation) facilitates electrodissolution of any region 160 that may have formed and/or return of the programmable device to an erased state after application of a sufficient voltage.

In accordance with one embodiment of the invention, at least one electrode 120 and 130 is formed of material suitable for use as an interconnect metal. For example, an electrode may form part of an interconnect structure within a semiconductor integrated circuit. In accordance with one aspect of this embodiment, the electrode is formed of a material that is substantially insoluble in material comprising ion conductor 140. Exemplary materials suitable for both interconnect and electrode 130 material include metals and compounds such as tungsten, nickel, molybdenum, platinum, metal silicides, and the like.

As noted above, programmable structures of the present invention may include one or more barrier or buffer layers interposed between at least a portion of ion conductor 140 and one of the electrodes 120, 130. The buffer layers may include ion conductors such as $Ag_xO$, $Ag_xS$, $Ag_xSe$, $Ag_xTe$, where $x \geq 2$, $Ag_xI$, where $x \geq 1$, $Cu_{(1,2)}I_2$, $Cu_{(1,2)}O$, $Cu_{(1,2)}S$, $Cu_{(1,2)}Se$, $Cu_{(1,2)}Te$, $GeO_2$, $Ge_zS_{1-z}$, $Ge_zSe_{1-z}$, $Ge_zTe_{1-z}$, $As_zS_{1-z}$, $As_zSe_{1-z}$, $As_zTe_{1-z}$, where z is greater than or equal to about 0.1, $SiO_{(1,2)}$, and combinations of these materials) interposed between ion conductor 140 and a metal layer such as silver and copper, or dielectric material such as $SiO_{(1,2)}$, $Si_3N_4$, and various polymers.

The barrier layer may also include a material that restricts migration of ions between conductor 140 and the electrodes, such as titanium nitride, titanium tungsten, a combination thereof, or the like. The barrier may be electrically indifferent, i.e., it allows conduction of electrons through a structure, but it does not itself contribute ions to conduction through the structure. An electrically indifferent barrier may reduce undesired electrodeposit growth during operation of the programmable device, and thus may facilitate an "erase"

or dissolution of region 160 when a bias is applied which is opposite to that used to grow region 160. In addition, use of a conducting barrier allows for the "indifferent" electrode to be formed of oxidizable material because the barrier prevents diffusion of the electrode material to the ion conductor.

Ion conductor 140 is formed of material that conducts ions upon application of a sufficient voltage. Suitable materials for ion conductor 140 include glasses and semiconductor materials. In general, ion conductors in accordance with the present invention can conduct ions without requiring a phase change, can conduct ions at a relatively low temperature (e.g., below 125° C.), can conduct ions at relatively low electrical currents, have a relatively high transport number, and exhibit relatively high ion conductivity. In accordance with various embodiments of the present invention, the ion conductor includes an oxide material. Exemplary oxide materials suitable for ion conductor 140 include $GeO_2$, $As_2O_3$, $Ag_2O$, $Cu_{(1,2)}O$, and $SiO_{(1,2)}$, $WO_x$, where x is typically 2–3, and other transition metal oxides.

Ion conductor 140 may also suitably include dissolved conductive material. For example, ion conductor 140 may comprise a solid solution that includes dissolved metals and/or metal ions. In accordance with one exemplary embodiment of the invention, conductor 140 includes metal and/or metal ions dissolved in an oxide material.

Referring again to FIG. 1, in accordance with one exemplary embodiment of the invention, at least a portion of structure 100 is formed within a via of an insulating material 170. Forming a portion of structure 100 within a via of an insulating material 170 may be desirable because, among other reasons, such formation allows relatively small structures, e.g., on the order of 10 nanometers, to be formed. In addition, insulating material 170 facilitates isolating various structures 100 from other electrical components.

Insulating material 170 as well as material 175 suitably includes material that prevents undesired diffusion of electrons and/or ions through portions of structure 100. In accordance with one embodiment of the invention, material 170, 175 includes silicon nitride, silicon oxynitride, polymeric materials such as polyimide or parylene, or any combination thereof.

Conductive layers 180, 185 may suitably be electrically coupled to one or more electrodes 120, 130 to facilitate forming electrical contact to the respective electrode. Layers 180, 185 may be formed of any conductive material and are preferably formed of a metal, alloy, or composition including aluminum, tungsten, silver or copper.

In accordance with one embodiment of the invention, structure 100 is formed by depositing insulating layer 175 overlying substrate 110. Various interconnects 116 are then formed in layer 175 using techniques such as damascene processing. First metallization layer 180 is then formed using, e.g., deposition and etch techniques, overlying layer 175. Insulating layer 170 is then deposited over layers 180 and 175, and vias are formed within layer 170 to allow formation of electrode 120 and plug 112 using, for example, damascene processing. Ion conductor 140 is then formed by oxidizing a portion of the material used to form electrode 120. By way of particular example, tungsten can take the form of metal tracks or via plugs in a circuit and the surface can be oxidized at low temperature (<400° C.) using, for example, plasma-enhanced oxidation in an $N_2O$ atmosphere at about 300° C. or wet chemical oxidation using an oxidizer with or without ultraviolet light exposure at room temperature. Note that the via plugs themselves can be used as the source of tungsten in the oxidation reaction, allowing the oxide electrolyte to "self-align" with the underlying conductor as shown in FIG. 1. Plugs 112 may desirably be covered with an appropriate material, such as silicon nitride, to prevent their oxidation during electrolyte formation. Next, conductive material—e.g., silver or copper is deposited and patterned to lie above the electrolyte; the same conductive materials may also be used to form the next level of metallization.

Figure 2:
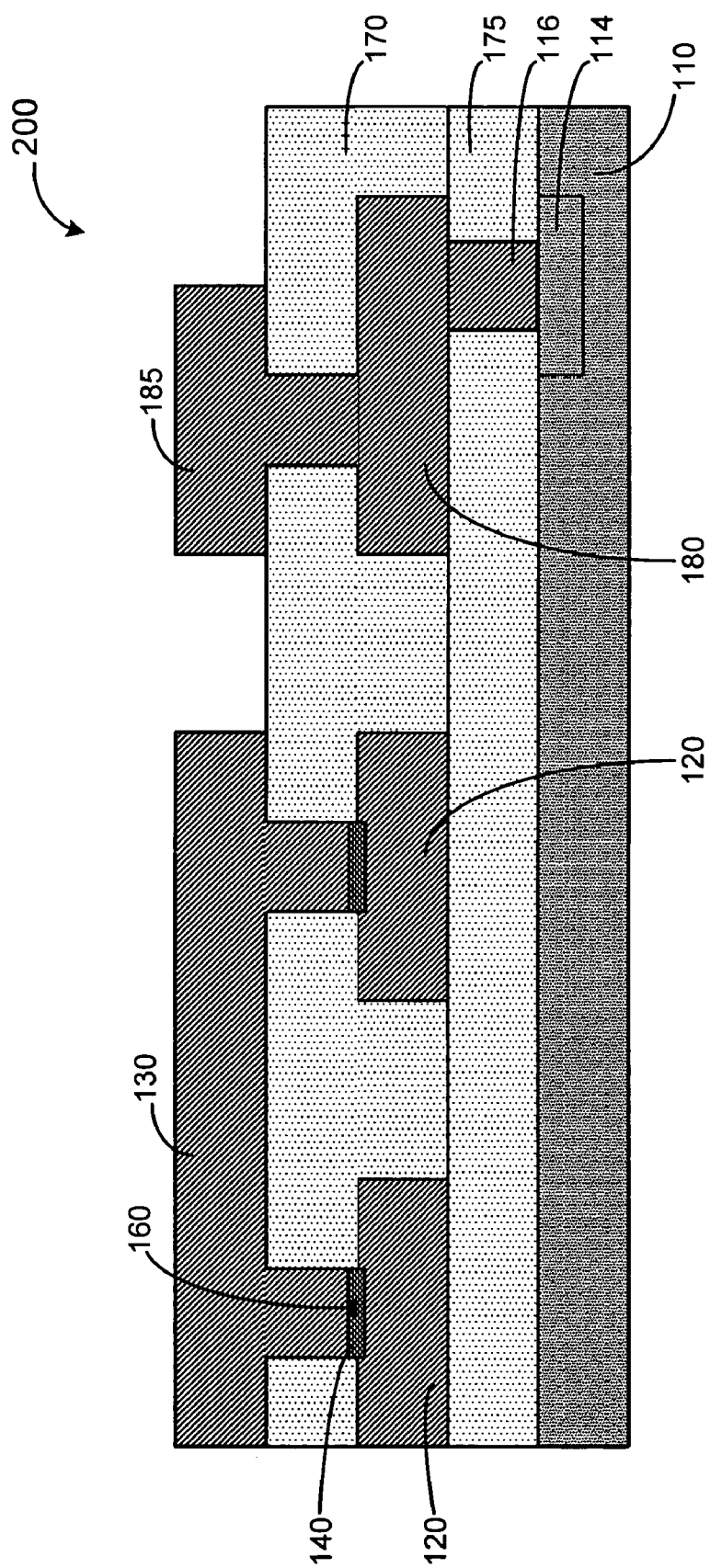
FIG. 2 is a cross-sectional illustration of a programmable structure formed on a surface of a substrate in accordance with another embodiment of the invention.

FIG. 2 illustrates another structure 200 in accordance with another embodiment of the invention. Structure 200 is formed in a manner similar to the manner in which structure 100 is formed, except a portion of metal layer 180 forms one of the electrodes and a portion of layer 180 is oxidized to form ion conductor 140. In this case, after insulating layer 170 is deposited over layers 175 and 180, vias are formed within layer 170 and portions of layer 180 are oxidized to form ion conductor 140. A conductive layer is then deposited and patterned overlying layers 180 and 175 to form electrode 130 and contact 185. A dual damascene process can be employed to form electrode 130 and contact 185.

Figure 3:
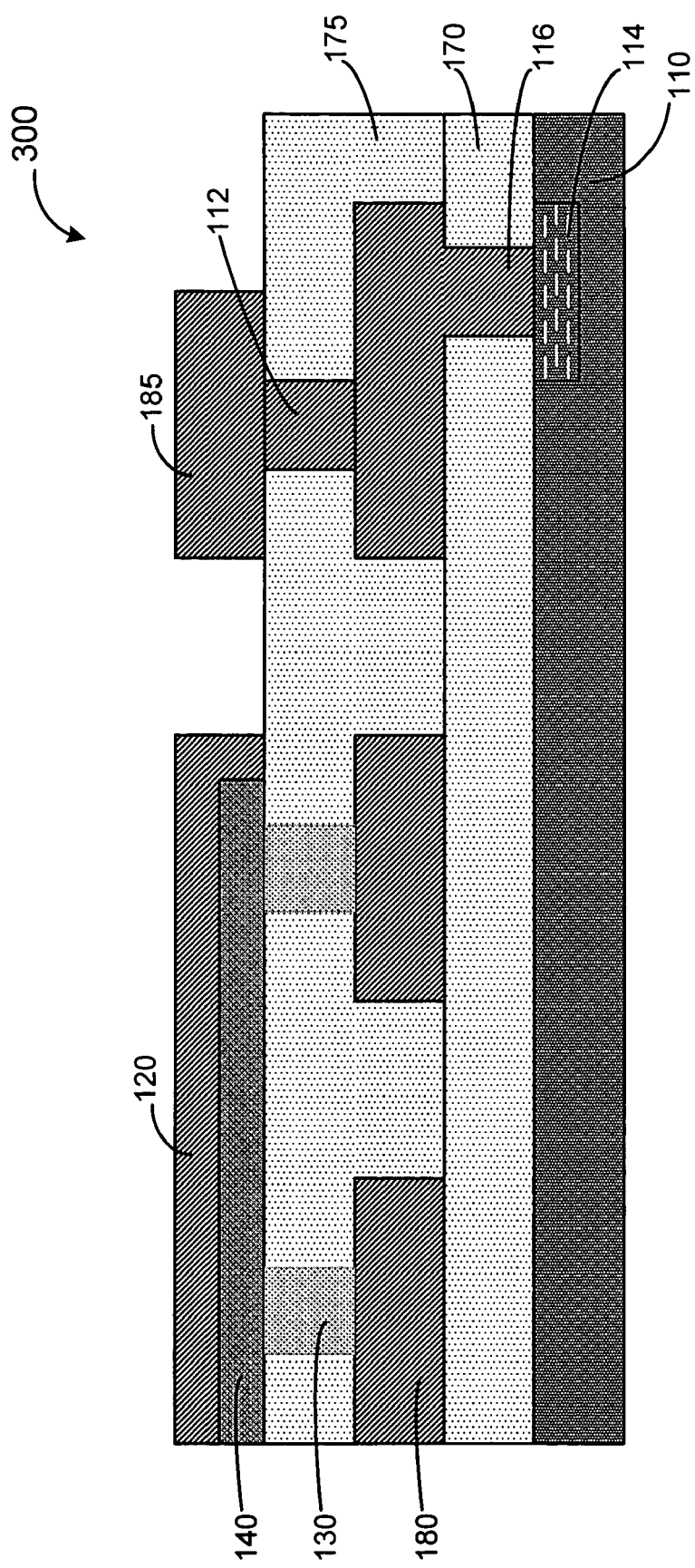
FIG. 3 is a cross-sectional illustration of a programmable structure formed on a surface of a substrate in accordance with yet another embodiment of the invention.

FIG. 3 illustrates another structure 300 in accordance with the present invention. Structure 300 is similar to structures 100 and 200 and is formed in a similar manner. Specifically, in accordance with one aspect of this embodiment, structure 300 is formed by forming layer 170, plug 116, and layers 180 and 175 as described above in connection with FIG. 1. Vias are then formed within layer 175 and electrode material such as silver is deposited within the vias to form electrode 130. As illustrated, other material such as tungsten may be deposited into additional vias formed within layer 175 to form plug 112. In this case, ion conductor 140 is formed overlying electrode 130 and layer 175 using for example, a plasma deposition and an etch process. The ion conductor material may be patterned to overly individual or multiple electrodes 130. A top layer interconnect metal layer is then deposited over ion conductor 140 and layer 175 to form electrode 120 and contact 185.

In accordance with an alternative embodiment of the invention, a similar structure may be formed by filling all the vias formed within layer 175 with conductive plug material such as tungsten, the depositing and patterning the ion conductor material, and then depositing and patterning the second electrode material. In this case, the second electrode material may lie beneath a second metallization level or form part of the second metallization level.

Figure 4:
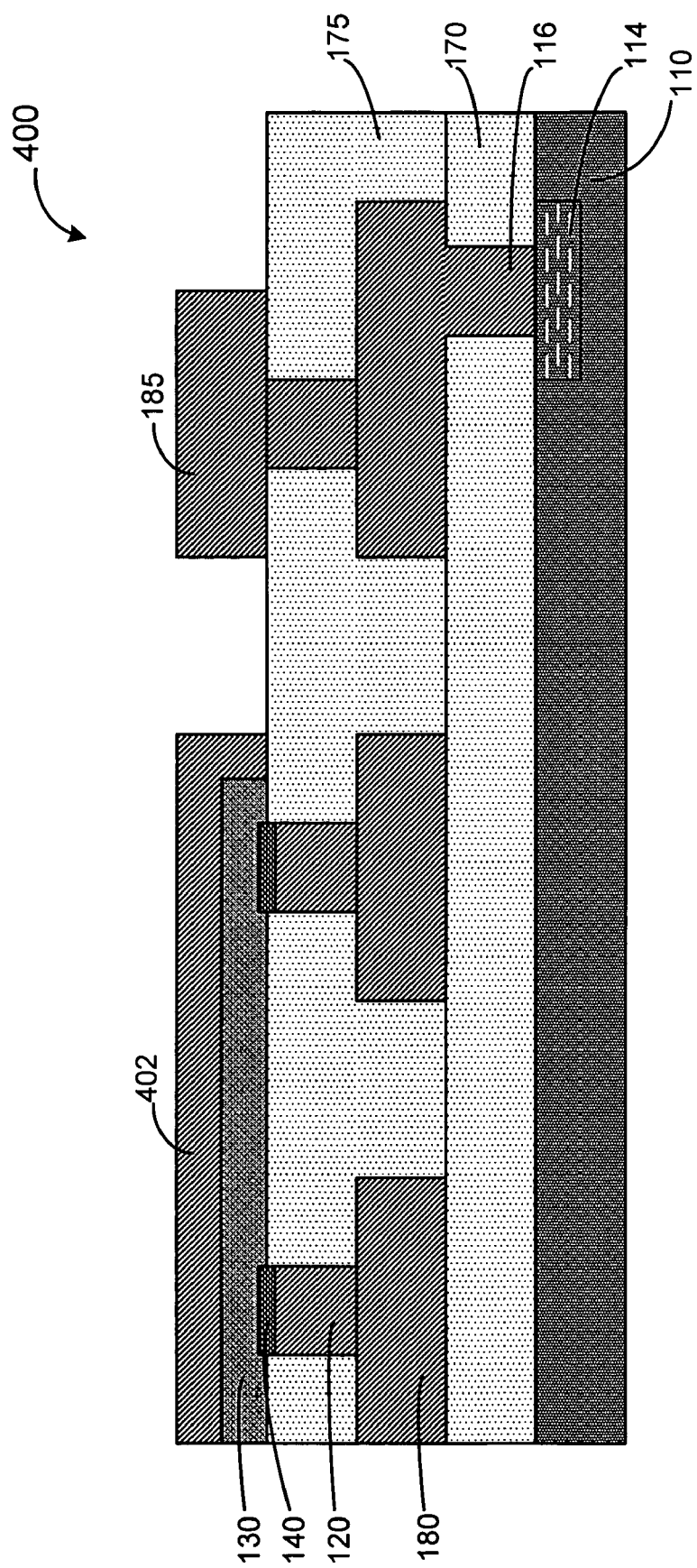
FIG. 4 is a cross-sectional illustration of a programmable structure formed on a surface of a substrate in accordance with another embodiment of the invention.

FIG. 4 illustrates yet another structure 400 in accordance with the present invention. Structure 400 is similar to structure 100, except structure 400 includes an additional metallization layer to form contacts 402 and 185.

Figure 5:
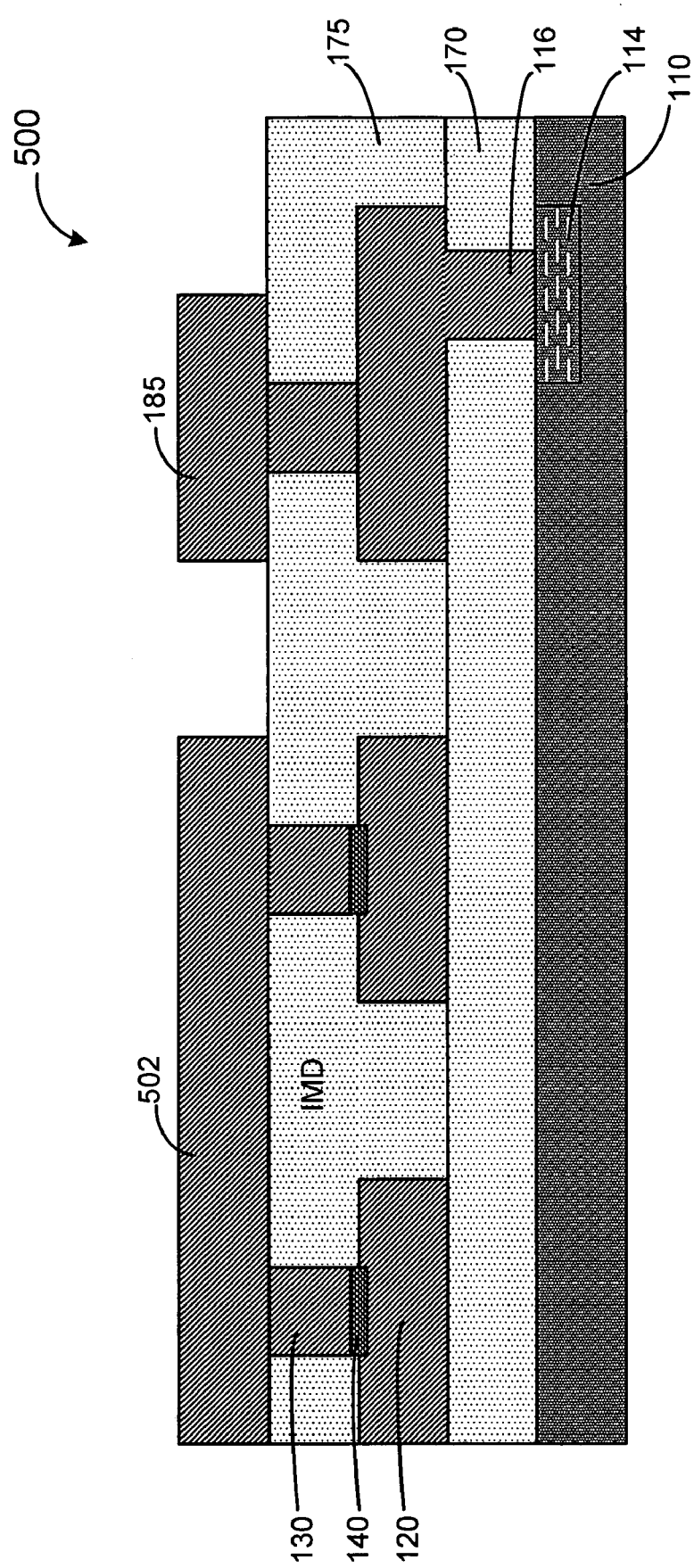
FIG. 5 is a cross-sectional illustration of a programmable structure formed on a surface of a substrate in accordance with yet another embodiment of the invention.

FIG. 5 illustrates a structure 500 in accordance with a further embodiment of the invention. Structure 500 is similar to structure 200, except structure 500 include an additional conductive layer to form contacts 502 and 185. In this case, excess material used to form electrodes 130 is removed from a surface of layer 175 prior to forming contacts 502 and 185.

As noted above, in accordance with various embodiments of the invention the ion conductor is doped This ion conductor 140 doping may be accomplished depositing sufficient metal adjacent an ion conductor material and applying sufficient electrical, thermal, optical or other electromagnetic energy to the layers such that a portion of the metal is dissolved within the ion conductor material and a portion of the metal remains on a surface of the ion conductor to form an electrode. Regions of differing conductivity within ion conductor 140 can be formed using this technique by applying a sufficient amount of energy to the structure such that a first portion of the ion conductor proximate the soluble electrode contains a greater amount of conductive material than a second portion of the ion conductor proximate the indifferent electrode. This process is self limiting if ion starting ion conductor layer is thick enough so that a portion of the film becomes saturated and a portion of the film is unsaturated. In accordance with alternative embodiments of the invention, solid solutions containing dissolved metals may be directly deposited and patterned to form ion conductor 140.

Information may be stored using programmable structures of the present invention by manipulating one or more electrical properties of the structures. For example, a resistance of a structure may be changed from a "0" or off state to a "1" or on state during a suitable write operation. Similarly, the device may be changed from a "1" state to a "0" state during an erase operation. In addition, the structure may have multiple programmable states such that multiple bits of information are stored in a single structure.

Write Operation

As noted above, when electrode 130 is coupled to a more negative end of a voltage supply, compared to electrode 120, a conductive region begins to form near electrode 130 and grow toward electrode 120. An effective threshold voltage ($V \geq V_T$) must be applied to a structure to cause region 160 to grow.

Read Operation

A state of a memory cell (e.g., 1 or 0) may be read, without significantly disturbing the state, by, for example, applying a forward or reverse bias of magnitude less than a voltage threshold for electrodeposition or by using a current limit which is less than or equal to the minimum programming current (the current which will produce the highest of the on resistance values). Another way of performing a non-disturb read operation is to apply a pulse, with a relatively short duration, which may have a voltage higher than the electrochemical deposition threshold voltage such that no appreciable Faradaic current flows, i.e., nearly all the current goes to polarizing/charging the device and not into the electrodeposition process.

Erase Operation

A programmable structure may suitably be erased by reversing a bias applied during a write operation, wherein a magnitude of the applied bias is equal to or greater than the threshold voltage for electrodeposition in the reverse direction. In accordance with an exemplary embodiment of the invention, a sufficient erase voltage ($V \geq V_T$) is applied to a structure for a period of time, which depends on energy supplied during the write operation, but is less than about 1 millisecond and typically less than 1 microsecond to return the structure to its "off" state having a resistance well in excess of a million ohms.

Pulse Mode Read/Write

In accordance with an alternate embodiment of the invention, pulse mode programming is used to write to and read from a programmable structure. In this case, similar to the process described above, region 160 forms during a write process; however, unlike the process described above, at least a portion region 160 is removed or dissolved during a read operation. During an erase/read process, the magnitude of the current pulse is detected to determine the state (1 or 0) of the device. If the device had not previously been written to or has previously been erased, no ion current pulse will be detected at or above the reduction/oxidation potential of the structure. But, if the device is in a written state, an elevated current will be detected during the destructive read/erase step. Because this is a destructive read operation, information must be written to each structure after each read process—similar to DRAM read/write operations. However, unlike DRAM devices, the structures of the present invention are stable enough to allow a range of values to be stored (e.g., various amounts of region 160). Thus, a partially destructive read that decrease, but does not completely eliminate region 160, can be used. In accordance with an alternate aspect of this embodiment, a destructive write process rather than a destructive erase process can be used read the device. In this case, if the cell is in an "off" state, a write pulse will produce an ion current spike as region 160 forms, whereas a device that already includes a region 160 will not produce the ion current spike if the process has been limited by a lack of oxidizable silver.

Control of Operational Parameters

The concentration of conductive material in the ion conductor can be controlled by applying a bias across the programmable device. For example, metal such as silver may be taken out of solution by applying a negative voltage in excess of the reduction potential of the conductive material. Conversely, conductive material may be added to the ion conductor (from one of the electrodes) by applying a bias in excess of the oxidation potential of the material. Thus, for example, if the conductive material concentration is above that desired for a particular device application, the concentration can be reduced by reverse biasing the device to reduce the concentration of the conductive material. Similarly, metal may be added to the solution from the oxidizable electrode by applying a sufficient forward bias. Additionally, it is possible to remove excess metal build up at the indifferent electrode by applying a reverse bias for an extended time or an extended bias over that required to erase the device under normal operating conditions. Control of the conductive material may be accomplished automatically using a suitable microprocessor.

A programmable structure in accordance with the present invention may be used in many applications that would otherwise utilize traditional technologies such as EEPROM, FLASH or DRAM. Advantages provided by the present invention over present memory techniques include, among other things, lower production cost and the ability to use flexible fabrication techniques that are easily adaptable to a variety of applications. The programmable structures of the present invention are especially advantageous in applications where cost is the primary concern, such as smart cards and electronic inventory tags. Also, an ability to form the memory directly on a plastic card is a major advantage in these applications as this is generally not possible with other forms of semiconductor memories.

Further, in accordance with the programmable structures of the present invention, memory elements may be scaled to less than a few square microns in size, the active portion of the device being much less than a few square microns. This provides a significant advantage over traditional semiconductor technologies in which each device and its associated interconnect can take up several tens of square microns.

Programmable structures and devices and system including the programmable structures described herein are advantageous because the programmable structures require relatively little internal voltage to perform write and erase functions, require relatively little current to perform the write and erase functions, are relatively fast (both write and read operations), require little to no refresh (even for "volatile" memory applications), can be formed in high-density arrays, are relatively inexpensive to manufacture, are robust and shock resistant, and do not require a monocrystalline starting material and can therefore be added to other electronic circuitry.

The structures of the present invention can be switched from one electrical condition to another and thus these structures can also be used to configure the functionality of logic devices. In such so-called erasable-programmable logic devices (EPLD), the switching elements are used to link sub-blocks or circuitry to create a circuit whose function depends on the specific configuration. This configuration may be set once, as in field programmable gate arrays (FPGA), or may be altered if the switching elements are able to be reprogrammed."

The programmable structure described herein can also be used to fabricate microstructures by dissolving the anode and plating out conductive material (e.g., silver) to redistribute mass of the structure, wherein the amount of mass distributed depends on the faradaic current applied across the electrodes. Such structures can be used to form non-volatile optical switches, MEMS relay contacts, and the like.

Although the present invention is set forth herein in the context of the appended drawing figures, it should be appreciated that the invention is not limited to the specific form shown. For example, while the programmable structure is conveniently described above in connection with programmable memory devices, the invention is not so limited; the structures of the present invention may additionally or alternatively be employed as programmable active or passive devices within a microelectronic circuit. Furthermore, although only some of the devices are illustrated as including buffer, barrier, or other components, any of these components may be added to the devices of the present invention. Various other modifications, variations, and enhancements in the design and arrangement of the method and apparatus set forth herein, may be made without departing from the spirit and scope of the present invention as set forth in the appended claims.

We claim:

1. A microelectronic programmable structure comprising:
   an insulating layer having a via formed therein;
   an ion conductor comprising an oxide electrolyte and conductive material;
   an oxidizable electrode proximate the ion conductor; and
   an indifferent electrode proximate the ion conductor;
   wherein at least one of the ion conductor, oxidizable electrode, and indifferent electrode is formed within at least a portion of the via.

2. The microelectronic programmable structure of claim 1, wherein the ion conductor comprises a material selected from the group consisting of $GeO_2$, $As_2O_3$, $Ag_2O$, $Cu_{(1,2)}O$, and $SiO_{(1,2)}$, $WO_x$.

3. The microelectronic programmable structure of claim 1, wherein the ion conductor comprises a material selected from the group consisting of $SiO_{(1,2)}$ and $WO_x$.

4. The microelectronic programmable structure of claim 1, wherein the oxidizable electrode comprises a material selected from the group consisting of silver and copper.

5. The microelectronic programmable structure of claim 1, wherein the indifferent electrode comprises tungsten.

6. The microelectronic programmable structure of claim 5, wherein the ion conductor comprises tungsten oxide.

7. The microelectronic programmable structure of claim 1, further comprising a barrier layer between the oxidizable electrode and the indifferent electrode.

8. The microelectronic programmable structure of claim 1, wherein the ion conductor is interposed between the indifferent electrode and the oxidizable electrode.

9. A method of forming a programmable microelectronic device, the method comprising the steps of:
   providing a substrate;
   forming a first insulating layer overlying the substrate;
   forming a second insulating layer overlying the first insulating layer;
   forming a via within the second insulating layer;
   filling the via with first electrode material;
   removing any excess first electrode material;
   forming an ion conductor overlying the first electrode material; and
   forming a second electrode material overlying the ion conductor.

10. The method of claim 9, wherein the step of forming an ion conductor comprises exposing the first electrode material to an oxidizing atmosphere to form an oxide ion conductor.

11. The method of claim 9, wherein the step of forming a second electrode material comprises the steps of:
   depositing a material comprising silver, copper, or a combination thereof; and
   patterning the second electrode material.

12. The method of claim 9, wherein the step of forming the first electrode comprises damascene processing.

13. The method of claim 9, wherein the step of forming the second electrode comprises damascene processing.

14. The method of claim 9, further comprising the step of forming a metal layer underlying the second insulating layer.

15. The method of claim 9, wherein the step of forming an ion conductor comprises depositing ion conductor material overlying the first electrode.

16. The method of claim 9, further comprising the step of depositing contact material overlying the second electrode.

17. The method of claim 9, wherein the step of filling the via with first electrode material comprises depositing oxidizable electrode material.

18. The method of claim 9, wherein the step of filling the via with first electrode material comprises depositing indifferent electrode material.

19. The method of claim 9, wherein the step of forming an ion conductor comprises oxidizing the first electrode material at a temperature less than about 400° C.

20. The method of claim 19, wherein the step of forming an ion conductor comprises using plasma-enhanced oxidation in an $N_2O$ atmosphere.

21. The method of claim 9, wherein the step of forming an ion conductor comprises exposing the first electrode material to a wet chemical oxidation process.

22. The method of claim 21, wherein the step of forming an ion conductor comprises exposing the first electrode material to ultraviolet light at room temperature.

23. A method of forming a programmable microelectronic device, the method comprising the steps of:
   providing a substrate;
   forming a first insulating layer overlying the substrate;
   forming a first electrode overlying the first insulating layer;
   forming an ion conductor overlying the first electrode material;
   wherein the step of forming an ion conductor comprises exposing the first electrode to an oxidizing atmosphere to form an oxide ion conductor;
   forming a second insulating layer overlying the first insulating layer;
   forming a via within the second insulating layer; and
   filling at least a portion of the via with second electrode material.

24. The method of claim 23, wherein the step of forming the first electrode comprises deposition and etch processing.

25. The method of claim 23, wherein the step of forming the second electrode comprises damascene processing.

26. The method of claim 23, wherein the step of forming an ion conductor comprises oxidizing the first electrode material at a temperature less than about 400° C.

27. The of claim 26, wherein the step of forming an ion conductor comprises using plasma-enhanced oxidation in an $N_2O$ atmosphere.

28. A method of forming a programmable microelectronic device, the method comprising the steps of:
   providing a substrate;
   forming a first insulating layer overlying the substrate;
   forming a first electrode overlying the first insulating layer;
   forming an ion conductor overlying the first electrode material;
   wherein the step of forming an ion conductor comprises exposing the first electrode material to a wet chemical oxidation process;
   forming a second insulating layer overlying the first insulating layer;
   forming a via within the second insulating layer; and
   filling at least a portion of the via with second electrode material.

29. The method of claim 28, wherein the step of forming an ion conductor comprises exposing the first electrode material to ultraviolet light at room temperature.

30. The method of claim 23, wherein the step of forming the second electrode comprises depositing oxidizable electrode material.

31. The method of claim 23, wherein the step of forming the second electrode comprises depositing indifferent electrode material.

32. The method of claim 23, wherein the step of forming an ion conductor comprises depositing ion conductor material overlying the first electrode.

* * * * *